US011163167B2

(12) United States Patent
Doyle et al.

(10) Patent No.: US 11,163,167 B2
(45) Date of Patent: Nov. 2, 2021

(54) FLEXIBLE PRINTED CIRCUIT BOARD FOR HEAD-MOUNTED DISPLAY

(71) Applicant: Microsoft Technology Licensing, LLC, Redmond, WA (US)

(72) Inventors: Patrick Robert Doyle, San Francisco, CA (US); Simon Hodgson, Morgan Hill, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/785,045

(22) Filed: Feb. 7, 2020

(65) Prior Publication Data

US 2021/0132395 A1 May 6, 2021

Related U.S. Application Data

(60) Provisional application No. 62/931,546, filed on Nov. 6, 2019.

(51) Int. Cl.
*G02B 27/01* (2006.01)
*H05K 1/18* (2006.01)

(52) U.S. Cl.
CPC ......... *G02B 27/0176* (2013.01); *H05K 1/189* (2013.01); *H05K 2201/10083* (2013.01); *H05K 2201/10128* (2013.01)

(58) Field of Classification Search
CPC ............... G02B 27/0176; H05K 1/189; H05K 2201/10128; H05K 2201/10083
See application file for complete search history.

(56) References Cited

U.S. PATENT DOCUMENTS

| 10,567,898 B1* | 2/2020 | Asfaw | H04N 5/2253 |
| 2005/0195491 A1* | 9/2005 | Bernard | H04N 5/74 |
| | | | 359/649 |
| 2006/0250574 A1* | 11/2006 | Grand | G02B 27/017 |
| | | | 351/158 |
| 2015/0062853 A1* | 3/2015 | Li | H01Q 1/22 |
| | | | 361/782 |
| 2017/0164483 A1* | 6/2017 | Kouchi | H01Q 1/38 |
| 2017/0255011 A1* | 9/2017 | Son | G02B 27/0081 |
| 2018/0219427 A1* | 8/2018 | Baek | H02J 50/40 |
| 2018/0310102 A1* | 10/2018 | Register | H05K 1/028 |
| 2019/0335546 A1* | 10/2019 | Jeong | H05B 45/40 |
| 2020/0004023 A1* | 1/2020 | Shin | G02B 6/0016 |

* cited by examiner

*Primary Examiner* — Carolyn R Edwards
(74) *Attorney, Agent, or Firm* — Alleman Hall Creasman & Tuttle LLP

(57) ABSTRACT

A head-mounted display device is provided, including an at least partially see-through display, an electrical device, and a flexible printed circuit board (FPC) arranged on a surface of a see-through portion of the display. The FPC may include a plurality of electrical traces electrically coupled to the electrical device. Each electrical trace may be separated from at least one other electrical trace by one or more respective see-through gaps. The FPC may further include a transparent material arranged between the electrical traces in each see-through gap.

18 Claims, 7 Drawing Sheets

FLEXIBLE PRINTED CIRCUIT BOARD FOR HEAD-MOUNTED DISPLAY

CROSS REFERENCE TO RELATED APPLICATIONS

This application claims priority to U.S. Provisional Patent Application Ser. No. 62/931,546, filed Nov. 6, 2019, the entirety of which is hereby incorporated herein by reference for all purposes.

BACKGROUND

The visor of a head-mounted display device may be used to display mixed-reality environments in which virtual objects are displayed on a see-through display such that they appear to be located in the user's physical environment. In addition, the visor may house sensors, output devices, and/or data processing circuits of the head-mounted display device. When such components are included in the visor, those components may be coupled to other components of the head-mounted display device with electrical traces.

SUMMARY

According to one aspect of the present disclosure, a head-mounted display device is provided, including an at least partially see-through display, an electrical device, and a flexible printed circuit board (FPC) arranged on a surface of a see-through portion of the display. The FPC may include a plurality of electrical traces electrically coupled to the electrical device. Each electrical trace may be separated from at least one other electrical trace by one or more respective see-through gaps. The FPC may further include a transparent material arranged between the electrical traces in each see-through gap.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

In existing head-mounted display devices, a printed circuit board including electrical traces passing through the visor is frequently visible to the wearer of the head-mounted display device. For example, in such head-mounted display devices, the printed circuit board may be visible as a black or amber band across the display. Thus, the printed circuit board may partially obstruct the wearer's view or distract the user from paying attention to other physical or virtual objects and may detract from the user experience.

One previous solution to the above problem uses silver traces that are deposited on the visor during manufacturing. Such traces may be less easily visible and thus less distracting to the user. However, deposited silver traces are difficult and expensive to manufacture. In addition, solder-joint connections between silver traces and other components are often fragile and unreliable. Failures and defects in deposited silver electrical traces may also be difficult to repair and in some instances may necessitate replacing the entire visor.

Figure 1:
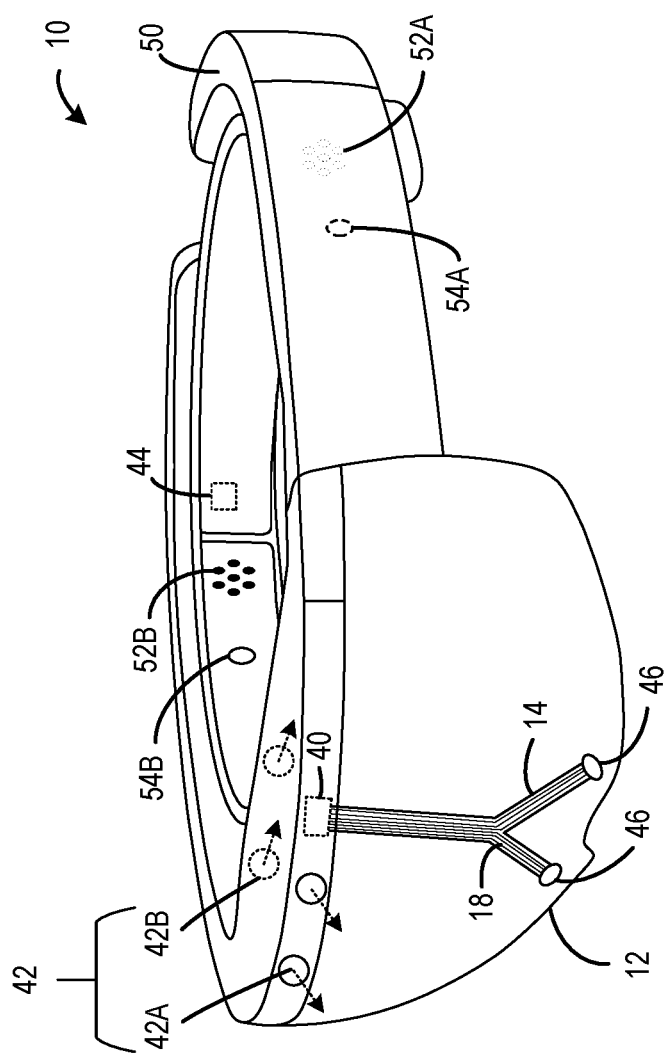
FIG. 1 shows an example head-mounted display device, according to one embodiment of the present disclosure.

In order to address the above shortcomings of existing head-mounted display devices, a head-mounted display (HMD) device 10 is provided, as shown in the example of FIG. 1. In the example of FIG. 1, the HMD device 10 includes a frame 50 that wraps around the head of the user to position the display 12, which takes the form of a near-eye display in this example, close to the user's eyes. The frame 50 supports additional components of the HMD device 10, such as, for example, a processor 40 and camera devices 42. The processor 40 includes logic and associated computer memory configured to provide image signals to the display 12, to receive sensory signals from camera devices 42 and other input devices, and to enact various control processes.

The display 12 may, for example, be a non-see-through Light-Emitting Diode (LED) display, a Liquid Crystal Display (LCD), or any other suitable type of non-see-through display. In an augmented reality configuration, the display 12 may be configured to enable a wearer of the HMD device 10 to view a physical, real-world object in the physical environment through one or more partially transparent pixels displaying virtual object representations. For example, the display 12 may include image-producing elements such as, for example, a see-through Organic Light-Emitting Diode (OLED) display. As another example, the HMD device 10 may include a light modulator on an edge of the display 12. In this example, the display 12 may serve as a light guide for delivering light from the light modulator to the eyes of a wearer. In other examples, the display 12 may utilize a liquid crystal on silicon (LCOS) display.

The display 12 may include one or more opaque portions as well as one or more see-through portions. The one or more opaque portions of the display 12 may be configured to display graphical content that does not appear to be superimposed upon the physical environment. For example, one or more two-dimensional or three-dimensional virtual reality objects may be displayed on the one or more opaque portions of the display 12. The respective surfaces of each of the one or more see-through portions and/or the one or more opaque portions may be curved along one or two dimensions, as shown in FIG. 1.

In addition to the display 12, the HMD device 10 may further include one or more output devices. In the example of FIG. 1, the HMD device 10 includes a left speaker 52A and a right speaker 52B configured to output sound. The left speaker 52A and the right speaker 52B may be positioned to be near the user's left ear and right ear respectively when worn. Thus, the HMD device 10 may be configured to produce stereo sound outputs via the left speaker 52A and the right speaker 52B. The HMD device 10 may further include one or more haptic feedback devices configured to produce touch output (e.g. vibration). In the example of FIG. 1, the HMD device 10 includes a left haptic feedback device 54A and a right haptic feedback device 54B.

The HMD device 10 shown in FIG. 1 further includes a plurality of input devices, including various sensors and related systems to provide information to the processor 40. Such sensors may include an inertial measurement unit (IMU) 44. The plurality of input devices may further include a camera device 42, which may include one or more outward facing camera devices 42A and one or more inward facing camera devices 42B. The one or more inward facing camera devices 42B may be configured to acquire image data in the form of gaze tracking data from a wearer's eyes.

The one or more outward facing camera devices 42A may be configured to capture and/or measure physical environment attributes of the physical environment in which the HMD device 10 is located. In one example, the one or more outward facing camera devices 42A may include a visible-light camera or RGB camera configured to collect a visible-light image of a physical space. Further, the one or more outward facing camera devices 42A may include a depth camera configured to collect a depth image of a physical space. More particularly, in one example the depth camera is an infrared time-of-flight depth camera. In another example, the depth camera is an infrared structured light depth camera.

Data from the outward facing camera devices 42A may be used by the processor 40 to generate and/or update a three-dimensional (3D) model of the physical environment. Data from the outward facing camera devices 42A may be used by the processor 40 to identify surfaces of the physical environment and/or measure one or more surface parameters of the physical environment. The processor 40 may execute instructions to generate/update virtual scenes displayed on display 12, identify surfaces of the physical environment, and recognize objects based on the identified surfaces in the physical environment. In augmented reality configurations of HMD device 10, the position and/or orientation of the HMD device 10 relative to the physical environment may be assessed so that augmented-reality images may be accurately displayed in desired real-world locations with desired orientations. The 3D model of the physical environment may include surface reconstruction information, which may include a geometric representation, such as a geometric mesh, of the physical environment.

The IMU 44 of the HMD device 10 may be configured to provide position and/or orientation data of the HMD device 10 to the processor 40. In one implementation, the IMU 44 may be configured as a three-degree of freedom (3DOF) position sensor system. This example position sensor system may, for example, include three gyroscopes to indicate or measure a change in orientation of the HMD device 10 within 3D space about three orthogonal axes (e.g., roll, pitch, and yaw). In another example, the IMU 44 may be configured as a six-degree of freedom (6DOF) position sensor system. Such a configuration may include three accelerometers and three gyroscopes to indicate or measure a change in location of the HMD device 10 along three orthogonal spatial axes (e.g., x, y, and z) and a change in device orientation about three orthogonal rotation axes (e.g., yaw, pitch, and roll). The orientation derived from the sensor signals of the IMU 44 may be used to display, via the display 12, one or more holographic images with a realistic and stable position and orientation.

The HMD device 10 may further include one or more microphones 46, which may be communicatively coupled to the processor 40. The one or more microphones 46 may, as shown in the example of FIG. 1, be positioned near the user's mouth when the HMD device 10 is worn, such that the one or more microphones 46 are positioned to receive speech input from the user. In some embodiments, the one or more microphones 46 may be one or more digital microphones 46 included in a digital microphone array. In such embodiments, the one or more microphones 46 in the microphone array may be configured to communicate with the processor 40 via pulse density modulation. The processor 40 may be further configured to perform beamforming using sound data received from the microphones 46 of the microphone array.

The one or more microphones 46 may be electrically coupled to the processor 40 by a plurality of electrical traces 18. In some embodiments, each electrical trace of the plurality of electrical traces may be a copper electrical trace having an oxidized surface. Alternatively, the plurality of electrical traces 18 may include one or more electrical traces 18 made from copper without an oxidized surface or made from some other material. The plurality of electrical traces 18 may include one or more data traces, one or more power traces, one or more clock traces, and one or more ground traces.

In some embodiments, additionally or alternatively to coupling one or more microphones 46 to the processor 40, the plurality of traces 18 may be connected to one or more other electrical devices. For example, the one or more other electrical devices may include one or more of an ambient light sensor, an antenna, an infrared detector or emitter, a MEMS sensor or actuator, a speaker, a pixel of the display 12, or some other electrical device included in the HMD device 10.

The plurality of electrical traces 18 may be included in a flexible printed circuit board (FPC) 14 arranged adjacent to a surface of a see-through portion of the display 12. In embodiments in which the surface of the see-through portion of the display 12 is curved along one or two dimensions, the FPC 14 may also be curved along the one or two dimensions. The width of the FPC 14 may be between 2 mm and 3 mm in some embodiments.

Figure 2:
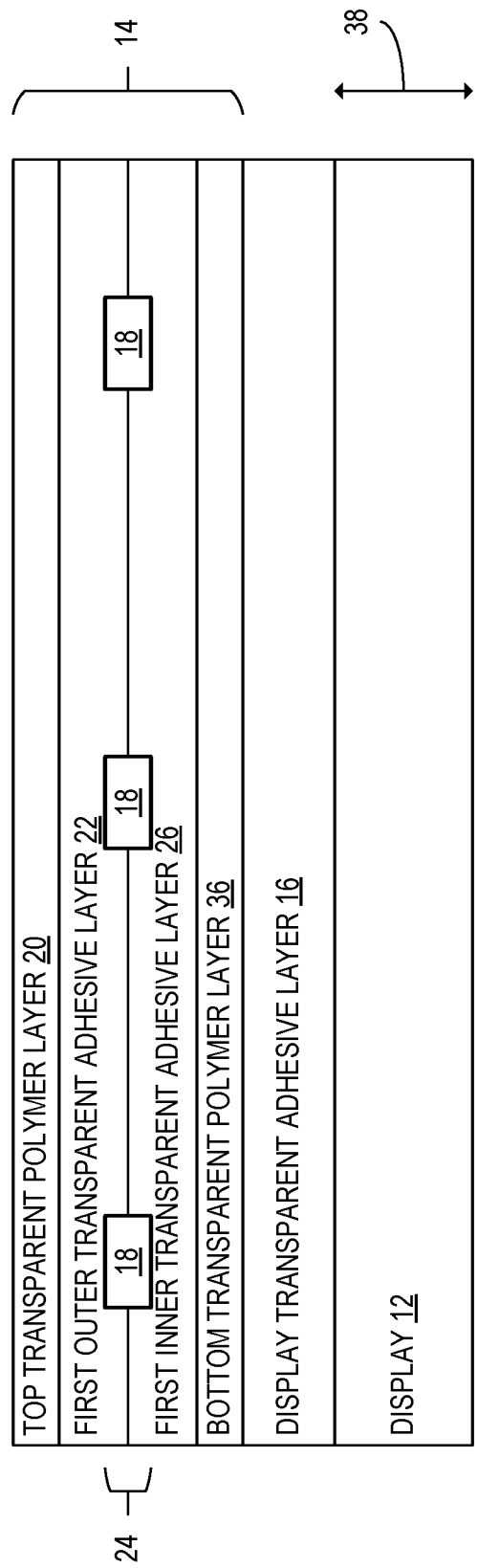
FIG. 2 shows a cross-sectional view of a flexible printed circuit board (FPC) included in the head-mounted display device, according to the embodiment of FIG. 1.

FIG. 2 shows an example cross-sectional view of the display 12 and the FPC 14. In the example of FIG. 2, the FPC 14 is adhered to the surface of the see-through portion of the display 12 with a display transparent adhesive layer 16. The display transparent adhesive layer 16 may, for example, be formed from an acrylic adhesive or a silicone adhesive. Alternatively, the display transparent adhesive layer 16 may be formed from some other optically clear adhesive material.

The FPC 14 shown in the example of FIG. 2 includes a top transparent polymer layer 20 located on a top surface of the FPC 14. The top transparent polymer layer 20 may, for example, by a polyimide layer. Alternatively, the top transparent polymer layer 20 may be formed from some other transparent polymer. The top transparent polymer layer 20 may protect the plurality of electrical traces 18 included in the FPC 14. The FPC 14 may further include a first outer transparent adhesive layer 22. The first outer transparent adhesive layer 22 may be located between the top transparent polymer layer and a first trace layer 24. Similarly to the display transparent adhesive layer, the first outer transparent adhesive layer 22 may be formed from an acrylic adhesive, a silicone adhesive, or some other optically clear adhesive material.

A first trace layer 24 may be provided below the first outer transparent adhesive layer 22. The first trace layer 24 may include the plurality of electrical traces 18. Each electrical trace 18 may be separated from at least one other electrical trace 18 by one or more respective see-through gaps. In addition, the first trace layer 24 may further include a transparent material arranged between the electrical traces 18 in each see-through gap. The transparent material may, for example, be the optically clear adhesive of the first outer transparent adhesive layer 22, which may extend into the first trace layer 24. The plurality of electrical traces 18 may be evenly spaced in the first trace layer 24 such that pairs of adjacent electrical traces 18 are separated by gaps that are substantially equal to each other in width. In some embodiments, each electrical trace 18 may have a respective width between 40 µm and 60 µm. Additionally or alternatively, the respective thickness of each electrical trace 18 in a thickness direction 38 of the display 12 may be between 12 µm and 35 µm. The gaps between the electrical traces 18 may, for example, have respective widths between 0.8 and 1.2 mm.

The FPC 14 may further include a first inner transparent adhesive layer 26 below the first trace layer 24 in the thickness direction 38. The first inner transparent adhesive layer 26 may be formed from an acrylic adhesive, a silicone adhesive, or some other optically clear adhesive material. Similarly to the first outer transparent adhesive layer 22, the first inner transparent adhesive layer 26 may extend into the first trace layer 24. In addition, the FPC 14 may include a bottom transparent polymer layer 36 below the first inner transparent adhesive layer 26. The first inner transparent adhesive layer 26 may adhere the first trace layer 24 to the bottom transparent polymer layer 36. The bottom transparent polymer layer 36 may be a polyimide layer in some embodiments or may alternatively be formed from some other transparent polymer. The display transparent adhesive layer 16 may adhere the bottom transparent polymer layer 36 to the display 12.

Figure 3:
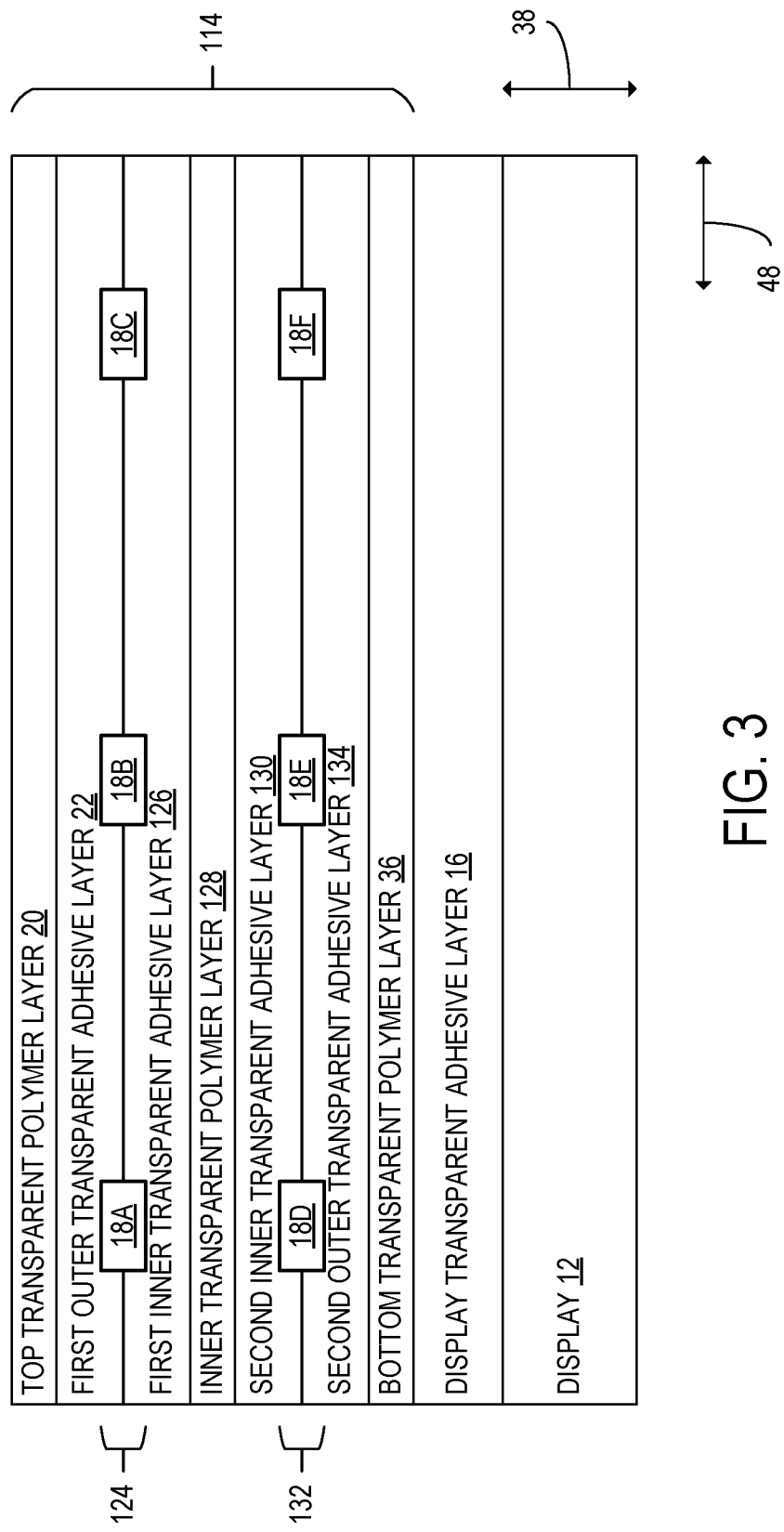
FIG. 3 shows a cross-sectional view of an FPC including a first trace layer and a second trace layer, according to the embodiment of FIG. 1.

FIG. 3 shows a cross-sectional view of an FPC 114 according to another embodiment. In some embodiments, as shown in the example of FIG. 3, the plurality of electrical traces 18 may be provided in a first trace layer 124 and a second trace layer 132. The first trace layer 124 may include a data trace 18A, a first power trace 18B, and a clock trace 18C. The second trace layer 132 may include a first ground trace 18D, a second power trace 18E, and a second ground trace 18F. The plurality of electrical traces 18 in the first trace layer 124 and the second trace layer 132 may be spaced evenly in a width direction 48 perpendicular to the thickness direction 38 of the display 12. When the electrical traces 18 are spaced evenly in the width direction 48, the distance between the data trace 18A and the first power trace 18B may be substantially equal to the distance between the first power trace 18B and the clock trace 18C. Similarly, the distance between the first ground trace 18D and the second power trace 18E may be substantially equal to the distance between the second power trace 18E and the second ground trace 18F.

In the example of FIG. 3, the first ground trace 18D and the second ground trace 18F are each located below another electrical trace 18 of the plurality of electrical traces 18 in the thickness direction 38 of the display 12. The first ground trace 18D is located below (closer to the display 12 than) the data trace 18A, and the second ground trace 18F is located below the clock trace 18C. In addition, the second power trace 18E is located below the first power trace 18B. Thus, the first ground trace 18D, the second power trace 18E, and the second ground trace 18F may be hidden from view and may be less likely to distract the user of the HMD device 10.

In addition, in embodiments in which the electrical device is a microphone 46 that communicates with a processor 40 via pulse density modulation, providing the data trace 18A and the clock trace 18C in close proximity to the first ground trace 18D and the second ground trace 18F respectively may allow the first ground trace 18D and the second ground trace 18F to act as more accurate reference lines for the data trace 18A and the clock trace 18C. Thus, providing the first ground trace 18D and the second ground trace 18F below the data trace 18A and the clock trace 18C may improve signal integrity when pulse density modulation is performed.

Figure 4:
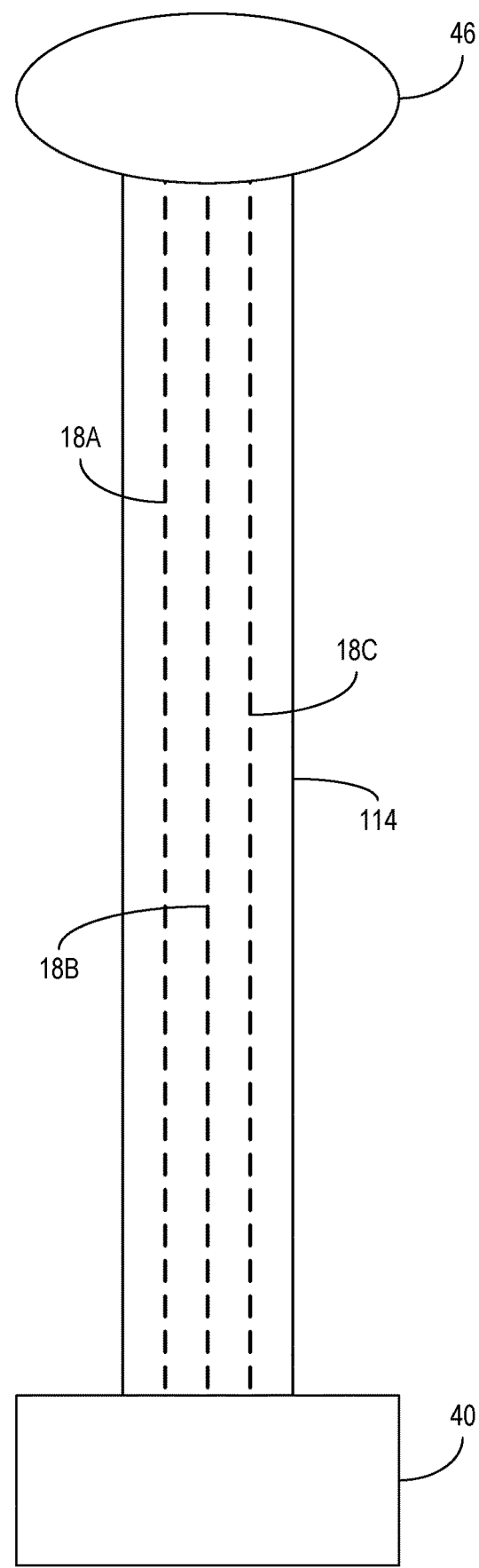
FIG. 4 shows a top view of the FPC, according to the embodiment of FIG. 1.

FIG. 4 shows an example top view of the FPC 114 electrically coupled to the microphone 46 and the processor 40 of the HMD device 10. As shown in FIG. 4, the data trace 18A, the first power trace 18B, and the clock trace 18C are visible but the first ground trace 18D, the second power trace 18E, and the second ground trace 18F are obscured.

Returning to FIG. 3, the FPC 114 may further include an inner transparent polymer layer 128 located between the first trace layer 124 and the second trace layer 132. The inner transparent polymer layer 128 may, for example, be a polyimide layer. Alternatively, the inner transparent polymer layer 128 may be made from some other transparent polymer. The inner transparent polymer layer 128 may insulate the first trace layer 124 and the second trace layer 132 from each other while still allowing light to pass through the FPC 114.

The FPC 114 may further include a plurality of transparent adhesive layers. In some embodiments, as shown in FIG. 2, the plurality of transparent adhesive layers may include a first inner transparent adhesive layer 126 between the inner transparent polymer layer 128 and the first trace layer 124. In some embodiments, the first inner transparent adhesive layer 126 may extend into the first trace layer 124 to form the transparent material located within the gaps between the electrical traces 18. The plurality of transparent adhesive layers may further include a second inner transparent adhesive layer 130 between the inner transparent polymer layer 128 and the second trace layer 132. In such embodiments, the first inner transparent adhesive layer 126 and the second inner transparent adhesive layer 130 adhere the inner transparent polymer layer 128 to the first trace layer 124 and the second trace layer 132 respectively. The second inner transparent adhesive layer 130 may also extend into the second trace layer 132 to form the transparent material that fills the gaps between the electrical traces 18 in the second trace layer 132.

In addition to the inner transparent polymer layer 128, the FPC 114 may further include a top transparent polymer layer 20 located on a top surface of the FPC 114, as in the example of FIG. 2. The FPC 114 may further include a bottom transparent polymer layer 36 located on a bottom surface of the FPC 114 opposite the first outer surface in the thickness direction 38 of the display 12.

The FPC 114 may further include a first outer transparent adhesive layer 22 located between the top transparent polymer layer 20 and the first trace layer 24. In addition, the FPC 114 may further include a second outer transparent adhesive layer 134 located between the second trace layer 32 and the bottom transparent polymer layer 36. The first outer transparent adhesive layer 22 and the second outer transparent adhesive layer 134 may be formed from an acrylic adhesive, a silicone adhesive, or some other optically clear adhesive material. Similarly to the second inner transparent adhesive layer 130, the second outer transparent adhesive layer 134 may extend into the gaps in the second trace layer 132.

Thus, the cross section of the HMD device 10 shown in FIG. 3 may include the following components arranged from a top side to a bottom side in a thickness direction 38. The HMD device 10 may first include an FPC 114 including a top transparent polymer layer 20, a first outer transparent adhesive layer 22, a first trace layer 124, a first inner transparent adhesive layer 126, an inner transparent polymer layer 128, a second inner transparent adhesive layer 130, a second trace layer 132, a second outer transparent adhesive layer 134, and a bottom transparent polymer layer 36. The first trace layer 124 may include a first plurality of electrical traces 18 electrically coupled to an electrical device such as a microphone 46. The second trace layer 132 may include a second plurality of electrical traces 18 coupled to the electrical device. The HMD device 10 may further include a display transparent adhesive layer 16 and an at least partially see-through display 12.

Figure 5:
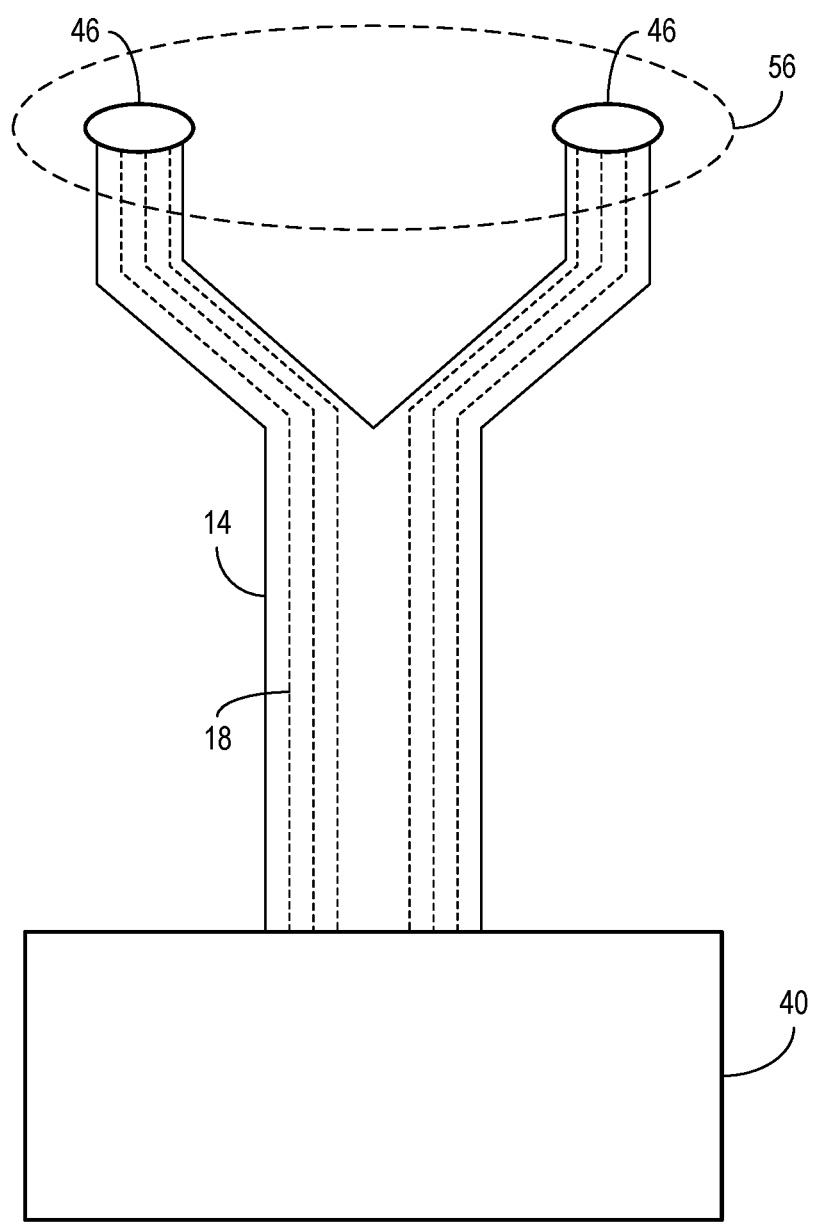
FIG. 5 shows a top view of a microphone array coupled to an FPC, according to the embodiment of FIG. 1.

FIG. 5 shows a microphone array 56 including a plurality of microphones 46. The microphone array 56 may include a left microphone and a right microphone of the HMD device 10, as shown in FIG. 1. The plurality of microphones 46 in the microphone array 56 are coupled to the processor 40 by an FPC 14. Alternatively, the FPC may be the FPC 114 of FIG. 3. The FPC 14 shown in FIG. 5 includes the respective electrical traces 18 of each of the plurality of microphones 46 in the microphone array 56. As discussed above, each microphone 46 in the microphone array 56 may be a digital microphone that may be configured to transmit sound data to the processor 40 via pulse density modulation.

Figure 6A:
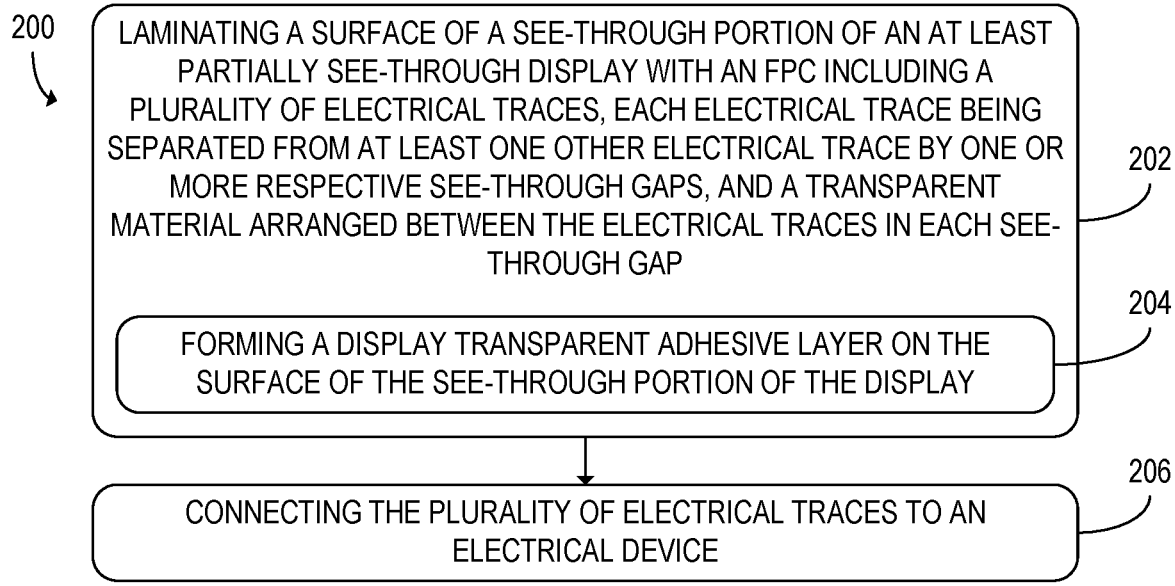
FIG. 6A shows a flowchart of a method for manufacturing a head-mounted display device, according to the embodiment of FIG. 1.

Turning now to FIG. 6A, a flowchart of a method 200 of manufacturing a head-mounted display device is provided. This method 200 may be used to manufacture the HMD device 10 of FIG. 1. At step 202, the method 200 may include laminating a surface of a see-through portion of an at least partially see-through display with an FPC. The FPC may include a plurality of electrical traces and a transparent material arranged between the electrical traces. The plurality of electrical traces may each be separated from at least one other electrical trace by one or more respective see-through gaps, and the transparent material may be provided in each see-through gap. In some embodiments, each electrical trace of the plurality of electrical traces may be a copper electrical trace having an oxidized surface. The transparent material arranged between the electrical traces may be an optically clear adhesive, which may flow into each see-through gap when the adhesive and the plurality of electrical traces are added to the FPC. The plurality of electrical traces may include one or more data traces, one or more power traces, one or more clock traces, and one or more ground traces.

In some embodiments, step 202 may include, at step 204, forming a display transparent adhesive layer on the surface of the see-through portion of the display. The display transparent adhesive layer may adhere the FPC to the display surface. At step 206, the method 200 may further include connecting the plurality of electrical traces to an electrical device. For example, the electrical device may be a microphone. Alternatively, the electrical device may be an ambient light sensor, an antenna, an infrared detector or emitter, a MEMS sensor or actuator, a pixel of the display, or some other electrical device included in the HMD device.

Figure 6B:
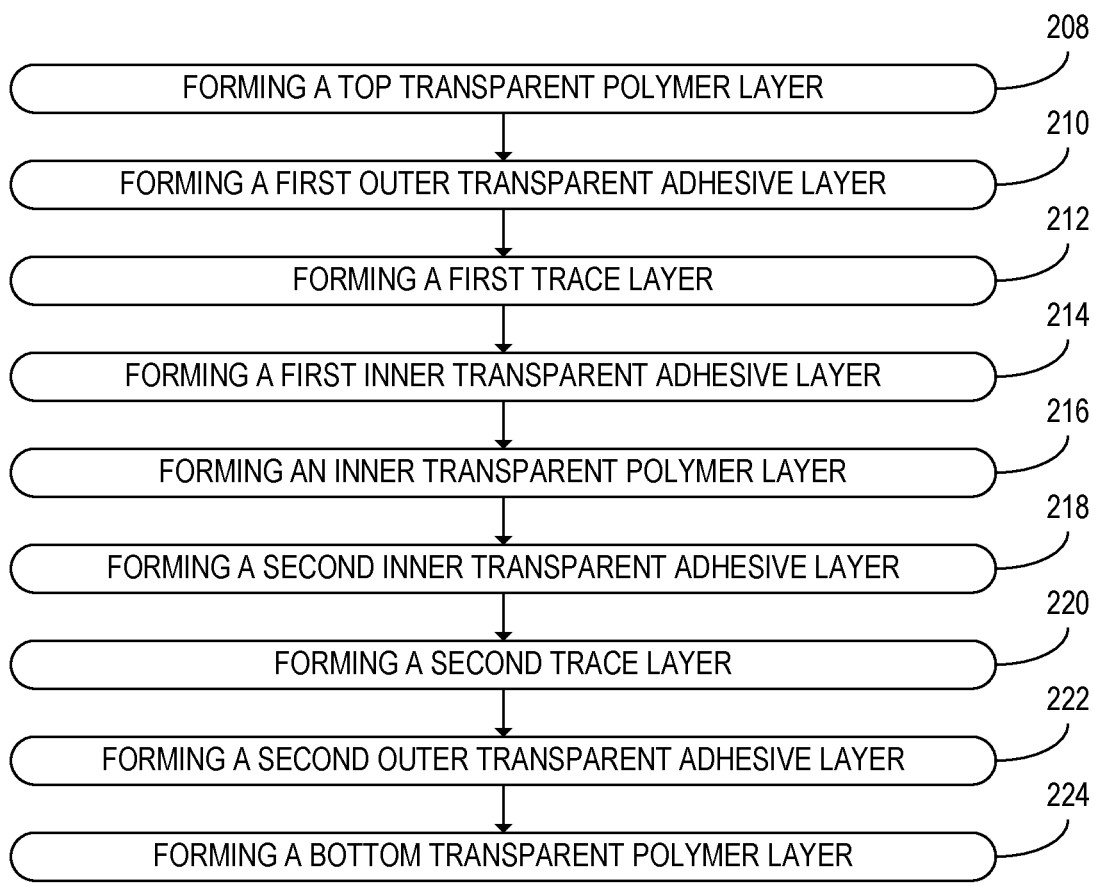
FIG. 6B shows additional steps that may be performed when manufacturing an FPC included in the head-mounted display device, according to the method of FIG. 6A.

FIG. 6B shows additional steps of the method 200 that may be performed when manufacturing the FPC. In the example of FIG. 6B, steps of forming the layers of the FPC are shown in descending order from higher layers of the HMD device (further from the display) to lower layers (closer to the display). However, in other embodiments, the layers of the FPC may be formed in ascending order or in some other order.

At step 208, the method 200 may further include forming a top transparent polymer layer. The top transparent polymer layer may be a polyimide layer in some embodiments, or alternatively may be formed from some other material. The top transparent polymer layer may be located on the top surface of the FPC. At step 210, the method 200 may further include forming a first outer transparent adhesive layer, which may adhere to the top transparent polymer layer. The first outer transparent layer may be formed from an optically clear adhesive such as an acrylic adhesive or a silicone adhesive.

At step 212, the method 200 may further include forming a first trace layer including one or more electrical traces of the plurality of electrical traces. The one or more electrical traces included in the first trace layer may be evenly spaced in a width direction of the FPC perpendicular to the thickness direction. At step 214, the method 200 may further include forming a first inner transparent adhesive layer. At step 216, the method 200 may further include forming an inner transparent polymer layer. The inner transparent adhesive layer may adhere the first trace layer to the inner transparent polymer layer. The inner transparent adhesive layer may be formed of an optically clear adhesive material, similarly to the first outer transparent adhesive layer. The inner transparent polymer layer may be a polyimide layer.

At step 218, the method 200 may further include forming a second inner transparent adhesive layer. The second inner transparent adhesive layer may be formed of an optically clear adhesive material, such as an acrylic adhesive or a silicone adhesive, and may adhere to the inner transparent polymer layer. At step 220, the method 200 may further include forming a second trace layer. The second trace layer may include a plurality of electrical traces, as discussed above, and may adhere to the second outer transparent adhesive layer. In embodiments in which the plurality of electrical traces include one or more data traces, one or more power traces, one or more clock traces, and one or more ground traces, each of the one or more ground traces may be located below another electrical trace of the plurality of electrical traces in the thickness direction of the display. Thus, each ground trace may be provided in the second trace layer below another electrical trace located in the first trace layer. The one or more electrical traces included in the second trace layer may also be evenly spaced in the width direction of the FPC.

At step 222, the method 200 may further include forming a second outer transparent adhesive layer. The second outer transparent adhesive layer may be formed of an optically clear adhesive material, such as an acrylic adhesive or a silicone adhesive, and may adhere to the second trace layer. At step 224, the method 200 may further include forming a bottom transparent polymer layer. The bottom transparent polymer layer may be located on a bottom surface of the FPC opposite the first outer surface in a thickness direction of the display. In some embodiments, the bottom transparent polymer layer may be a polyimide layer. The bottom transparent polymer layer may adhere to the display transparent adhesive layer.

In some embodiments, the methods and processes described herein may be tied to a computing system of one or more computing devices. In particular, such methods and processes may be implemented as a computer-application program or service, an application-programming interface (API), a library, and/or other computer-program product.

Figure 7:
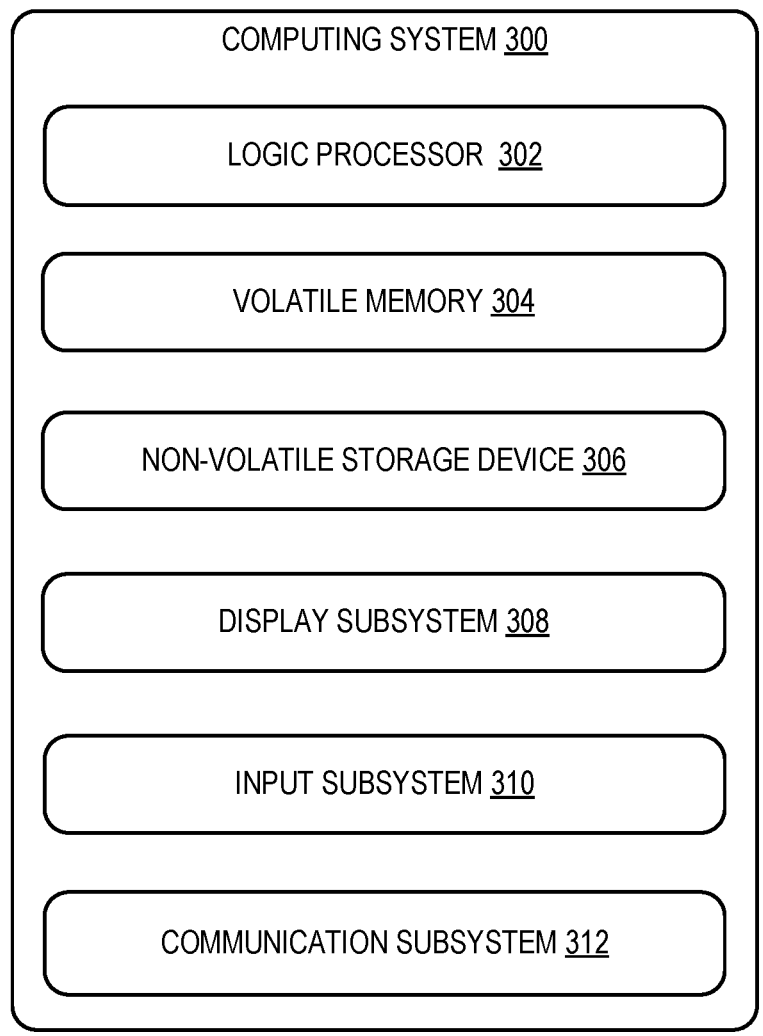
FIG. 7 shows a schematic view of an example computing environment in which the computer device of FIG. 1 may be enacted.

FIG. 7 schematically shows a non-limiting embodiment of a computing system 300 that can enact one or more of the methods and processes described above. Computing system 300 is shown in simplified form. Computing system 300 may embody the head-mounted display device 10 described above and illustrated in FIG. 1. Computing system 300 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing system 300 includes a logic processor 302 volatile memory 304, and a non-volatile storage device 306. Computing system 300 may optionally include a display subsystem 308, input subsystem 310, communication subsystem 312, and/or other components not shown in FIG. 7.

Logic processor 302 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 302 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 306 includes one or more physical devices configured to hold instructions executable by the logic processors to implement the methods and processes described herein. When such methods and processes are implemented, the state of non-volatile storage device 306 may be transformed—e.g., to hold different data.

Non-volatile storage device 306 may include physical devices that are removable and/or built-in. Non-volatile storage device 306 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 306 may include nonvolatile, dynamic, static, read/write, read-only, sequential-access, location-addressable, file-addressable, and/or content-addressable devices. It will be appreciated that non-volatile storage device 306 is configured to hold instructions even when power is cut to the non-volatile storage device 306.

Volatile memory 304 may include physical devices that include random access memory. Volatile memory 304 is typically utilized by logic processor 302 to temporarily store information during processing of software instructions. It will be appreciated that volatile memory 304 typically does not continue to store instructions when power is cut to the volatile memory 304.

Aspects of logic processor 302, volatile memory 304, and non-volatile storage device 306 may be integrated together into one or more hardware-logic components. Such hardware-logic components may include field-programmable gate arrays (FP GAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 300 typically implemented in software by a processor to perform a particular function using portions of volatile memory, which function involves transformative processing that specially configures the processor to perform the function. Thus, a module, program, or engine may be instantiated via logic processor 302 executing instructions held by non-volatile storage device 306, using portions of volatile memory 304. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 308 may be used to present a visual representation of data held by non-volatile storage device 306. The visual representation may take the form of a graphical user interface (GUI). As the herein described methods and processes change the data held by the non-volatile storage device, and thus transform the state of the non-volatile storage device, the state of display subsystem 308 may likewise be transformed to visually represent changes in the underlying data. Display subsystem 308 may include one or more display devices utilizing virtually any type of technology. Such display devices may be combined with logic processor 302, volatile memory 304, and/or non-volatile storage device 306 in a shared enclosure, or such display devices may be peripheral display devices.

When included, input subsystem 310 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 312 may be configured to communicatively couple various computing devices described herein with each other, and with other devices. Communication subsystem 312 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 300 to send and/or receive messages to and/or from other devices via a network such as the Internet.

According to one aspect of the present disclosure, a head-mounted display device is provided, including an at least partially see-through display and an electrical device. The head-mounted display device may further include a flexible printed circuit board (FPC) arranged on a surface of a see-through portion of the display. The FPC may include a plurality of electrical traces electrically coupled to the electrical device. Each electrical trace may be separated from at least one other electrical trace by one or more respective see-through gaps. The FPC may further include a transparent material arranged between the electrical traces in each see-through gap.

According to this aspect, the plurality of electrical traces are located in at least a first trace layer and a second trace layer of the FPC. An inner transparent polymer layer may be located between the first trace layer and the second trace layer.

According to this aspect, the plurality of electrical traces may include one or more data traces, one or more power traces, one or more clock traces, and one or more ground traces.

According to this aspect, each of the one or more ground traces may be located below another electrical trace of the plurality of electrical traces in a thickness direction of the display.

According to this aspect, the inner transparent polymer layer may be a polyimide layer.

According to this aspect, the FPC may further include a plurality of transparent adhesive layers.

According to this aspect, the plurality of transparent adhesive layers may include a first inner transparent adhesive layer between the inner transparent polymer layer and the first trace layer. The plurality of transparent adhesive layers may further include a second inner transparent adhesive layer between the inner transparent polymer layer and the second trace layer.

According to this aspect, the FPC may further include a top transparent polymer layer located on a top surface of the FPC. The FPC may further include a bottom transparent polymer layer located on a bottom surface of the FPC opposite the top surface in a thickness direction of the display.

According to this aspect, the FPC may further include a first outer transparent adhesive layer located between the top transparent polymer layer and the first trace layer. The FPC may further include a second outer transparent adhesive layer located between the second trace layer and the bottom transparent polymer layer. The head-mounted display device may further include a display transparent adhesive layer located between the bottom transparent polymer layer and the display.

According to this aspect, each electrical trace of the plurality of electrical traces may be a copper electrical trace having an oxidized surface.

According to this aspect, the electrical device may be a microphone.

According to this aspect, the head-mounted display device may further include a processor coupled to the plurality of electrical traces.

According to this aspect, the microphone may be a digital microphone included in a digital microphone array and configured to communicate with the processor via pulse density modulation.

According to this aspect, the surface of the see-through portion of the display may be curved along one or two dimensions. The FPC may be curved along the one or two dimensions.

According to this aspect, each electrical trace may be a respective width between 40 µm and 60 µm.

According to this aspect, a width of the FPC is between 2 mm and 4 mm.

According to another aspect of the present disclosure, a method of manufacturing a head-mounted display device is provided. The method may include laminating a surface of a see-through portion of an at least partially see-through display with a flexible printed circuit board (FPC). The FPC may include a plurality of electrical traces, each electrical trace being separated from at least one other electrical trace by one or more respective see-through gaps. The FPC may further include a transparent material arranged between the electrical traces in each see-through gap. The method may further include connecting the plurality of electrical traces to an electrical device.

According to this aspect, manufacturing the head-mounted display device may further include forming a top transparent polymer layer located on a top surface of the FPC. Manufacturing the head-mounted display device may further include forming a bottom transparent polymer layer located on a bottom surface of the FPC opposite the first outer surface in a thickness direction of the display.

According to this aspect, manufacturing the head-mounted display device may further include forming a first trace layer and a second trace layer that each include one or more electrical traces of the plurality of electrical traces. Manufacturing the head-mounted display device may further include forming an inner transparent polymer layer located between the first trace layer and the second trace layer.

According to another aspect of the present disclosure, a head-mounted display device is provided, including, arranged from a top side to a bottom side in a thickness direction, a flexible printed circuit, a bottom transparent polymer layer, a display transparent adhesive layer, and an at least partially see-through display. The flexible printed circuit may include a top transparent polymer layer, a first outer transparent adhesive layer, a first electrical trace layer including a first plurality of electrical traces coupled to an electrical device, a first inner transparent adhesive layer, an inner transparent polymer layer, a second inner transparent adhesive layer, a second electrical trace layer including a second plurality of electrical traces coupled to the electrical device, and a second outer transparent adhesive layer.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A head-mounted display device, comprising:
   an at least partially see-through display;
   an electrical device; and
   a flexible printed circuit board (FPC) arranged on a surface of a see-through portion of the display and including:
   a plurality of electrical traces electrically coupled to the electrical device, each electrical trace being separated from at least one other electrical trace by one or more respective see-through gaps; and
   a transparent material arranged between the electrical traces in each see-through gap, wherein:
   the plurality of electrical traces are located in at least a first trace layer and a second trace layer of the FPC; and
   an inner transparent polymer layer is located between the first trace layer and the second trace layer.

2. The head-mounted display device of claim 1, wherein the plurality of electrical traces include one or more data traces, one or more power traces, one or more clock traces, and one or more ground traces.

3. The head-mounted display device of claim 2, wherein each of the one or more ground traces is located below another electrical trace of the plurality of electrical traces in a thickness direction of the display.

4. The head-mounted display device of claim 1, wherein the inner transparent polymer layer is a polyimide layer.

5. The head-mounted display device of claim 1, wherein the FPC further includes a plurality of transparent adhesive layers.

6. The head-mounted display device of claim 5, wherein the plurality of transparent adhesive layers include:
   a first inner transparent adhesive layer between the inner transparent polymer layer and the first trace layer; and
   a second inner transparent adhesive layer between the inner transparent polymer layer and the second trace layer.

7. The head-mounted display device of claim 1, wherein the FPC further includes:
   a top transparent polymer layer located on a top surface of the FPC; and
   a bottom transparent polymer layer located on a bottom surface of the FPC opposite the top surface in a thickness direction of the display.

8. The head-mounted display device of claim 7, wherein: the FPC further includes:
   a first outer transparent adhesive layer located between the top transparent polymer layer and the first trace layer;
   a second outer transparent adhesive layer located between the second trace layer and the bottom transparent polymer layer; and
   the head-mounted display device further includes a display transparent adhesive layer located between the bottom transparent polymer layer and the display.

9. The head-mounted display device of claim 1, wherein each electrical trace of the plurality of electrical traces is a copper electrical trace having an oxidized surface.

10. The head-mounted display device of claim 1, wherein the electrical device is a microphone.

11. The head-mounted display device of claim 9, further comprising a processor coupled to the plurality of electrical traces.

12. The head-mounted display device of claim 11, wherein the microphone is a digital microphone included in a digital microphone array and is configured to communicate with the processor via pulse density modulation.

13. The head-mounted display device of claim 1, wherein:
    the surface of the see-through portion of the display is curved along one or two dimensions; and
    the FPC is curved along the one or two dimensions.

14. The head-mounted display device of claim 1, wherein each electrical trace has a respective width between 40 μm and 60 μm.

15. The head-mounted display device of claim 1, wherein a width of the FPC is between 2 mm and 4 mm.

16. A method of manufacturing a head-mounted display device, the method comprising:
    laminating a surface of a see-through portion of an at least partially see-through display with a flexible printed circuit board (FPC) including:
    a plurality of electrical traces, each electrical trace being separated from at least one other electrical trace by one or more respective see-through gaps; and
    a transparent material arranged between the electrical traces in each see-through gap;
    forming:
    a first trace layer and a second trace layer that each include one or more electrical traces of the plurality of electrical traces; and
    an inner transparent polymer layer located between the first trace layer and the second trace layer; and
    connecting the plurality of electrical traces to an electrical device.

17. The method of claim 16, wherein manufacturing the head-mounted display device further includes forming:
    a top transparent polymer layer located on a top surface of the FPC; and
    a bottom transparent polymer layer located on a bottom surface of the FPC opposite the first outer surface in a thickness direction of the display.

18. A head-mounted display device, comprising:
    arranged from a top side to a bottom side in a thickness direction:
    a flexible printed circuit including:
    a top transparent polymer layer;
    a first outer transparent adhesive layer;
    a first electrical trace layer including a first plurality of electrical traces coupled to an electrical device;
    a first inner transparent adhesive layer;
    an inner transparent polymer layer;
    a second inner transparent adhesive layer;
    a second electrical trace layer including a second plurality of electrical traces coupled to the electrical device; and
    a second outer transparent adhesive layer;
    a bottom transparent polymer layer;
    a display transparent adhesive layer; and
    an at least partially see-through display.

* * * * *